(12) United States Patent
Wang et al.

(10) Patent No.: US 8,921,238 B2
(45) Date of Patent: Dec. 30, 2014

(54) METHOD FOR PROCESSING HIGH-K DIELECTRIC LAYER

(75) Inventors: Shao-Wei Wang, Taichung (TW);
Yu-Ren Wang, Tainan (TW);
Chien-Liang Lin, Taoyuan County (TW); Wen-Yi Teng, Kaohsiung (TW);
Tsuo-Wen Lu, Kaohsiung (TW);
Chih-Chung Chen, Tainan (TW);
Ying-Wei Yen, Miaoli County (TW)

(73) Assignee: United Microelectronics Corp., Science-Based Industrial Park, Hsin-Chu (TW)

(*) Notice: Subject to any disclaimer, the term of this patent is extended or adjusted under 35 U.S.C. 154(b) by 0 days.

(21) Appl. No.: 13/235,515

(22) Filed: Sep. 19, 2011

(65) Prior Publication Data

US 2013/0072030 A1 Mar. 21, 2013

(51) Int. Cl.
*H01L 21/31* (2006.01)
*H01L 21/3105* (2006.01)
*H01L 21/02* (2006.01)

(52) U.S. Cl.
CPC ....... *H01L 21/3105* (2013.01); *H01L 21/02148* (2013.01); *H01L 21/02178* (2013.01); *H01L 21/02181* (2013.01); *H01L 21/02183* (2013.01); *H01L 21/02192* (2013.01); *H01L 21/02197* (2013.01); *H01L 21/0228* (2013.01)
USPC ............................ 438/785; 438/287; 438/778

(58) Field of Classification Search
USPC ......................... 438/785, 778, 287
See application file for complete search history.

(56) References Cited

U.S. PATENT DOCUMENTS

| | | | |
|---|---|---|---|
| 5,498,768 A | 3/1996 | Nishitani | |
| 6,063,698 A | 5/2000 | Tseng | |
| 6,204,203 B1 * | 3/2001 | Narwankar et al. | 438/785 |
| 6,251,761 B1 | 6/2001 | Rodder | |
| 6,380,104 B1 | 4/2002 | Yu | |
| 6,492,217 B1 | 12/2002 | Bai | |
| 6,642,066 B1 | 11/2003 | Halliyal | |
| 6,656,852 B2 | 12/2003 | Rotondaro | |
| 6,696,345 B2 | 2/2004 | Chau | |
| 6,818,517 B1 | 11/2004 | Maes | |
| 6,818,553 B1 | 11/2004 | Yu | |
| 6,841,484 B2 | 1/2005 | Ying | |
| 6,921,711 B2 | 7/2005 | Cabral, Jr. | |
| 7,012,027 B2 | 3/2006 | Perng | |
| 7,030,430 B2 | 4/2006 | Doczy | |
| 7,126,199 B2 | 10/2006 | Doczy | |
| 7,135,361 B2 * | 11/2006 | Visokay et al. | 438/197 |
| 7,157,378 B2 | 1/2007 | Brask | |
| 7,160,767 B2 | 1/2007 | Brask | |
| 7,208,366 B2 | 4/2007 | Tsai | |
| 7,371,649 B2 | 5/2008 | Cheng | |

(Continued)

FOREIGN PATENT DOCUMENTS

WO WO/2010/098121 * 9/2010 ............ H01L 21/316

*Primary Examiner* — Zandra Smith
*Assistant Examiner* — Jamie C Niesz
(74) *Attorney, Agent, or Firm* — Winston Hsu; Scott Margo

(57) ABSTRACT

A method for processing a high-k dielectric layer includes the following steps. A semiconductor substrate is provided, and a high-k dielectric layer is formed thereon. The high-k dielectric layer has a crystalline temperature. Subsequently, a first annealing process is performed, and a process temperature of the first annealing process is substantially smaller than the crystalline temperature. A second annealing process is performed, and a process temperature of the second annealing process is substantially larger than the crystalline temperature.

14 Claims, 3 Drawing Sheets

(56) References Cited

U.S. PATENT DOCUMENTS

| | | |
|---|---|---|
| 7,381,608 B2 | 6/2008 | Brask |
| 7,384,880 B2 | 6/2008 | Brask |
| 7,488,656 B2 | 2/2009 | Cartier |
| 7,501,336 B2 | 3/2009 | Doyle |
| 7,521,324 B2 | 4/2009 | Ohmi |
| 7,601,648 B2 | 10/2009 | Chua |
| 7,824,990 B2 | 11/2010 | Chang |
| 2004/0007561 A1 | 1/2004 | Nallan |
| 2004/0161899 A1* | 8/2004 | Luo et al. ............... 438/287 |
| 2005/0127417 A1* | 6/2005 | Saenger et al. ........... 257/295 |
| 2005/0202624 A1 | 9/2005 | Li |
| 2005/0275035 A1 | 12/2005 | Mathew |
| 2006/0054943 A1 | 3/2006 | Li |
| 2006/0094192 A1 | 5/2006 | Yang |
| 2006/0172548 A1 | 8/2006 | Wu |
| 2006/0211259 A1 | 9/2006 | Maes |
| 2006/0284271 A1 | 12/2006 | Doyle |
| 2008/0070395 A1 | 3/2008 | Yen |
| 2008/0157231 A1 | 7/2008 | Wang |
| 2009/0057787 A1 | 3/2009 | Matsuki |
| 2009/0075434 A1* | 3/2009 | Junker et al. ............. 438/143 |
| 2009/0179283 A1 | 7/2009 | Adams |
| 2009/0181530 A1* | 7/2009 | Lisiansky et al. ......... 438/591 |
| 2009/0311877 A1* | 12/2009 | Olsen et al. .............. 438/770 |
| 2010/0062592 A1 | 3/2010 | Clark |
| 2010/0068877 A1 | 3/2010 | Yeh |
| 2010/0075507 A1 | 3/2010 | Chang |
| 2010/0081262 A1 | 4/2010 | Lim |
| 2010/0184281 A1 | 7/2010 | Hsu |
| 2010/0219481 A1 | 9/2010 | Tseng |
| 2012/0021612 A1* | 1/2012 | Nakagawa et al. ........ 438/785 |

* cited by examiner

US 8,921,238 B2

METHOD FOR PROCESSING HIGH-K DIELECTRIC LAYER

BACKGROUND OF THE INVENTION

1. Field of the Invention

The present invention relates to a method for processing a high-k (high dielectric constant) dielectric layer and more particularly, to an annealing process for processing a high-k dielectric layer.

2. Description of the Prior Art

With a trend towards scaling down the size of metal-oxide-semiconductors (MOS), the thickness of a gate dielectric layer must be reduced; if the gate dielectric layer is insufficient for sustaining a breakdown voltage, however, the phenomenon of serious leakage current will occur. Additionally, boron penetration from the polysilicon gate results in a deterioration of the device performance. Therefore, the semiconductor industry tends to use metal gates and high-K (high dielectric constant) materials to replace the conventional polysilicon gate and silicon oxide gate dielectric layer.

An annealing process is further implemented for improving the quality of gate dielectric layer formed through the atomic layer deposition (ALD) process or other processes. The gate dielectric layer made of oxide and the gate dielectric layer made of high-k materials are different; accordingly, as the annealing processes applicable for the gate dielectric layer made of oxide are used to process the gate dielectric layer made of high-k materials, the temperature profiles of the temperature controllers in the process tool may disperse. In other words, the consistency of the temperature controller performance is lost. This will adversely impact the process stability, and in a worst-case scenario, cause the wafer to be broken. How to establish an annealing process suitable for improving the quality and the reliability of high-k dielectric layer is therefore still an important issue in the field.

SUMMARY OF THE INVENTION

An objective of the present invention is to provide a method for processing a high-k (high dielectric constant) dielectric layer to improve the quality of the high-k dielectric layer.

According to one exemplary embodiment of the present invention, the method for processing a high-k dielectric layer includes the following steps. A semiconductor substrate is provided, and a high-k dielectric layer is formed on the semiconductor substrate, in which the high-k dielectric layer has a crystalline temperature. Subsequently, a first annealing process is performed, and a process temperature of the first annealing process is substantially smaller than the crystalline temperature. A second annealing process is performed, and a process temperature of the second annealing process is substantially larger than the crystalline temperature.

The present invention provides a two-step process for processing the high-k dielectric layer, and the two-step process includes the first annealing process and the second annealing process. The first annealing process and the second annealing process are preferably performed in respective reactor chambers. The first annealing process is for recovering defects on/around the surface of the high-k dielectric layer, and the second annealing process is for adjusting the location of the crystalline region in the high-k dielectric layer away from the interface between the high-k dielectric layer and the semiconductor substrate.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention, preferred exemplary embodiments will be described in detail. The preferred exemplary embodiments of the present invention are illustrated in the accompanying drawings with numbered elements.

Figure 1:
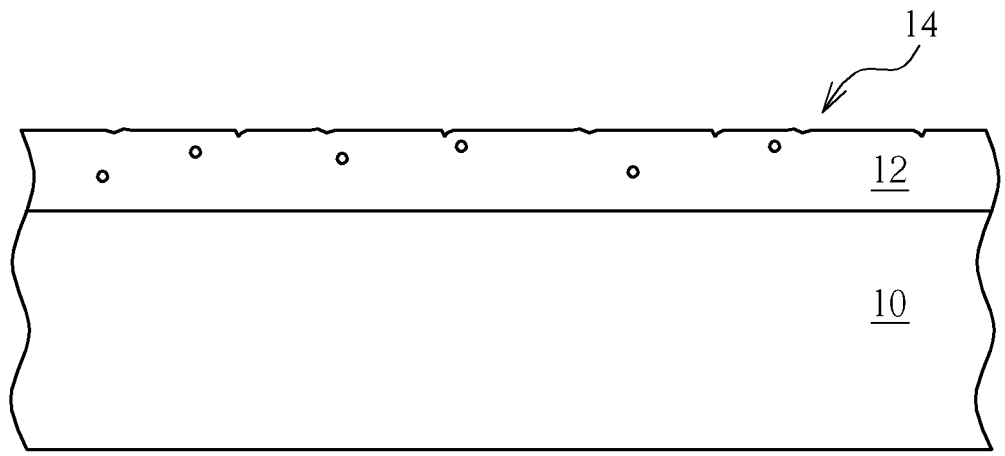
FIG. 1 through FIG. 5 illustrate a method for processing a high-k (high dielectric constant) dielectric layer according to a preferred exemplary embodiment of the present invention.

Please refer to FIG. 1 through FIG. 5, which illustrate a method for processing a high-k (high dielectric constant) dielectric layer according to a preferred exemplary embodiment of the present invention. As shown in FIG. 1, a semiconductor substrate 10 is provided. The semiconductor substrate 10 may be a substrate composed of AsGa, silicon on insulator (SOI) layer, epitaxial layer, SiGe layer or other semiconductor material. A high-k dielectric layer 12 is formed on the semiconductor substrate 10, and the high-k dielectric layer 12 has a crystalline temperature. The material of the high-k dielectric layer 12 may be hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate ($SrBi_2Ta_2O_9$, SBT), lead zirconate titanate ($PbZr_xTi_{1-x}O_3$, PZT), barium strontium titanate ($Ba_xSr_{1-x}TiO_3$, BST) or a combination thereof. The high-k dielectric layer 12 can be formed through an atomic layer deposition (ALD) process or a metal-organic chemical vapor deposition (MOCVD) process, but is not limited thereto. The high-k dielectric layer 12 made of $HfO_2$ through the ALD process is taken as an example herein. As the ALD process is performed, the precursor is preferably $HfCl_4$ and the oxidation source is preferably steam ($H_2O$). In another aspect, if the high-k dielectric layer 12 is formed through the MOCVD process, the precursor may be organic metal. Herein, the high-k dielectric layer 12 may be an amorphous film having a loose structure, and some oxygen vacancies 14 are on/around the surface of the high-k dielectric layer 12.

For enhancing the quality of the high-k dielectric layer, the present invention provides a two-step annealing process performed on the high-k dielectric layer. The annealing process of the present invention can be performed in any type of suitable reactor chamber. The suitable reactor chambers can execute a rapid thermal process (RTP) such as a spike rapid thermal process or a soak rapid thermal process, a laser spike annealing process, a flash annealing process, a dynamic surface annealing process or a combination of the illustrated processes.

Figure 2:
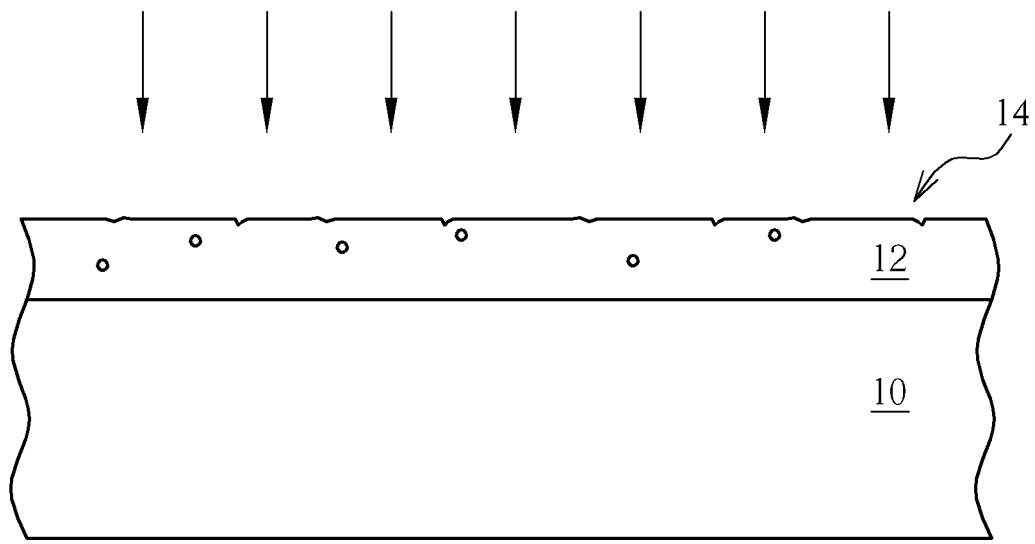
Figure 3:
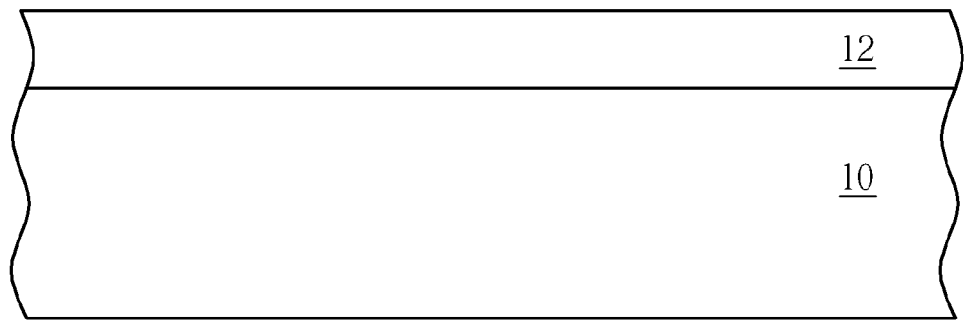

Subsequently, as shown in FIG. 2, a first annealing process is performed in a first reactor chamber. The first annealing process may be a soak rapid thermal process, but is not limited thereto. A process temperature of the first annealing process is substantially smaller than the crystalline temperature of the high-k dielectric layer 12: for example, the process temperature of the first annealing process is substantially smaller than 500 degrees centigrade (C). Additionally, a first process gas is introduced during the first annealing process. The process temperature of the first annealing process is preferably and substantially between 300 C and 400 C, and the first process gas has a plurality of free radicals for recovering defects such as the oxygen vacancies 14 on/around the surface of the high-k dielectric layer 12, as shown in FIG. 3. The free radicals of the first process gas include oxygen radicals (O radical) or nitrogen radicals (N radical). Through the process of heating, ultraviolet (UV), or plasma, the oxygen radicals may be formed by the ionization of the oxygen ($O_2$) or the ozone ($O_3$), and the nitrogen radicals may be formed by the ionization of the ammonia ($NH_3$). For example, the high-k dielectric layer 12 is heated by the heater and surrounded by the first process gas including oxygen radicals in the first annealing process, and the diagram of the temperature versus time is a horizontal line. In other words, the initial temperature of the first reactor chamber and the predetermined process temperature of the first annealing process are substantially the same. In this exemplary embodiment, the process temperature of the first annealing process is substantially a fixed value between 300 C and 400 C. Furthermore, the process time can be defined as the interval which starts at 50 seconds after the high-k dielectric layer 12 enters the first reactor chamber, and ends at 80 seconds before the high-k dielectric layer 12 leaves the first reactor chamber. The process time of the first annealing process is preferably between 20 seconds and 120 seconds. It is appreciated that the first annealing process including the free radicals facilitates the recovery of the defects such as oxygen vacancies 14 on/around the surface of the high-k dielectric layer 12, and reduces the occurrence of the current leakage as the high-k dielectric layer 12 is later integrated into the semiconductor devices.

Figure 4:
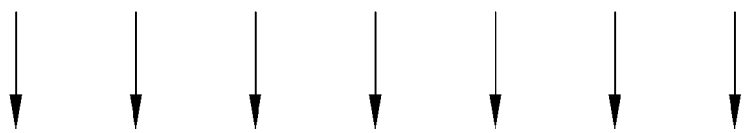
Figure 4:
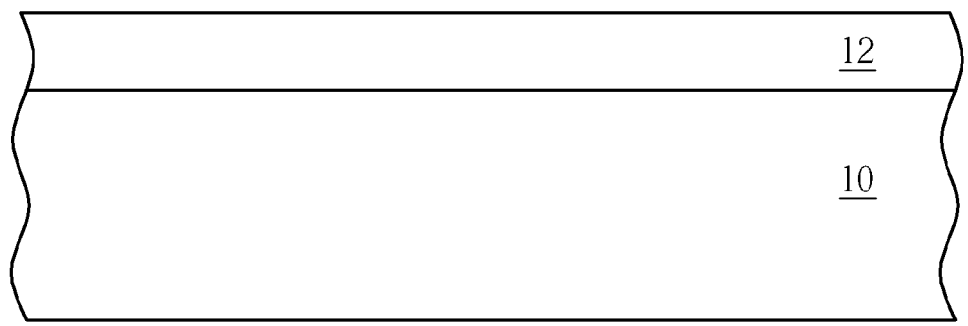
Figure 5:
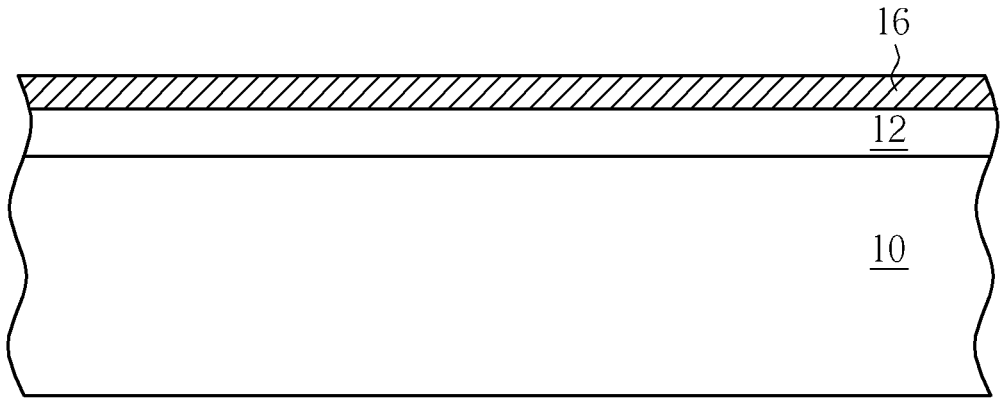

As shown in FIG. 4, a second annealing process is performed in a second reactor chamber. The second annealing process may be a laser spike annealing process, but is not limited thereto. A process temperature of the second annealing process is substantially larger than the crystalline temperature of the high-k dielectric layer 12: for example, the process temperature of the second annealing process is substantially larger than 500 C. Additionally, a second process gas is introduced during the second annealing process. The second process gas may be nitrogen ($N_2$) or an inert gas with low reactivity. For example, the high-k dielectric layer 12 is heated by the laser source and surrounded by the second process gas such as nitrogen in the second annealing process, and the diagram of the temperature versus time is a spike. In other words, in the second annealing process, the initial temperature of the second reactor chamber can be substantially room temperature, subsequently ramped up to a predetermined process temperature, i.e. the peak temperature of the temperature profile, and then ramped back down to the initial room temperature. In this exemplary embodiment, the predetermined process temperature of the second annealing process is preferably and substantially between 800 C and 900 C. Furthermore, the process time can be defined as the interval from the first time point that the temperature is lower than the predetermined temperature by 400 C to the second time point where the temperature is ramped down to a temperature lower 400 C than the predetermined temperature. The process time of the second annealing process is preferably between 10 seconds and 20 seconds. It should be appreciated that the second annealing process has a process temperature that is substantially larger than the crystalline temperature of the high-k dielectric layer 12; accordingly, the second annealing process can assist the transformation of the high-k dielectric layer 12. That is, the high-k dielectric layer 12 can be transformed from an amorphous film having a loose structure into the tenser high-k dielectric layer 12 having a crystalline region 16, as shown in FIG. 5. The short process time of the second annealing process avoids the overall crystallization of the high-k dielectric layer 12, and adjusts the location of the crystalline region 16 in the high-k dielectric layer 12 away from the interface between the high-k dielectric layer 12 and the semiconductor substrate 10 to meet the requirement of the localized crystallization. This will facilitate the performance of the semiconductor device into which the high-k dielectric layer 12 is later integrated.

The first annealing process and the second annealing process have respective operating conditions such as different predetermined process temperature and different types of process gas. In order to obtain the stable temperature profiles simultaneously for the processes having the different process temperature ranges and prevent the mutual disturbance of the process gases (for example, the residual first process gas having oxygen radicals may cause a deposition of unnecessary oxide film on the high-k dielectric layer during the second annealing process), it is preferable that the first annealing process and the second annealing process are performed respectively in the first reactor chamber and the second reactor chamber, but not limited thereto.

In addition, the present invention may be applied in various semiconductor processes such as metal gate processes including a gate-first process, a high-k first process integrated into the gate-last process, and a high-k last process integrated into the gate-last process.

Figure 6:
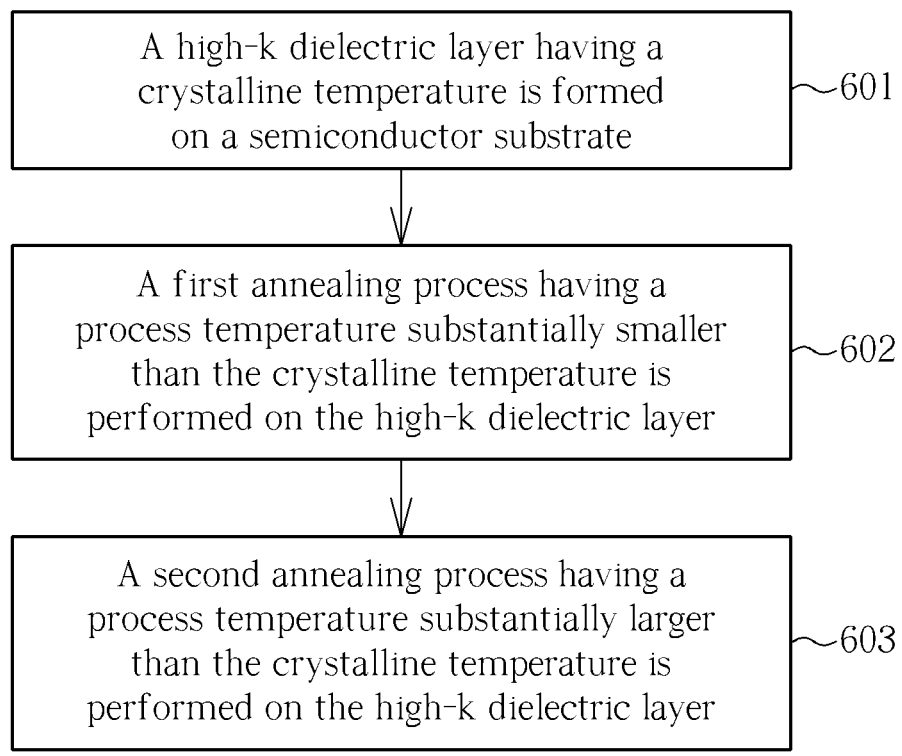
FIG. 6 is a flow chart illustrating a method for processing a high-k dielectric layer according to a preferred exemplary embodiment of the present invention.

To clarify the characteristics of the present invention, a flow chart is used to explain the method of the present invention again. Please refer to FIG. 6, and refer to FIG. 1 through FIG. 5 together. FIG. 6 is a flow chart illustrating a method for processing a high-k dielectric layer according to a preferred exemplary embodiment of the present invention. As shown in step 601, a high-k dielectric layer is formed on a semiconductor substrate, and the high-k dielectric layer may be an amorphous film having a loose structure herein. Then, as shown in step 602, a first annealing process is performed on the high-k dielectric layer. The first annealing process may be a soak rapid thermal process. A process temperature of the first annealing process is substantially smaller than a crystalline temperature of the high-k dielectric layer, and a first process gas having a plurality of free radicals such as oxygen radicals is introduced. The aim of this step is to recover the defects such as the oxygen vacancies on/around the surface of the high-k dielectric layer without affecting the crystalline status of the high-k dielectric layer. Furthermore, as shown in step 603, a second annealing process is performed on the high-k dielectric layer. The second annealing process is preferably a laser spike annealing process. A process temperature of the second annealing process is substantially larger than the crystalline temperature of the high-k dielectric layer, and a second process gas is introduced. The second process gas such as nitrogen has a lower reactivity than the first process gas. The aim of this step is to form the localized crystalline region away from the interface between the high-k dielectric layer and the semiconductor substrate, and the high-k dielectric layer may be an amorphous film having a tenser structure.

In conclusion, the present invention provides a two-step process for processing a high-k dielectric layer, and the two-step process includes a first annealing process and a second annealing process. The first annealing process and the second annealing process are preferably performed in respective reactor chambers. The first annealing process is for recovering defects on/around the surface of the high-k dielectric layer, and the second annealing process is for adjusting the location of the crystalline region in the high-k dielectric layer away from the interface between the high-k dielectric layer and the semiconductor substrate. The present invention improves the integrity of the high-k dielectric layer and facilitates the performance of the semiconductor devices into which the high-k dielectric layer is later integrated.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for processing a high-k (high dielectric constant) dielectric layer, comprising:
   providing a semiconductor substrate;
   forming a high-k dielectric layer on the semiconductor substrate, wherein the high-k dielectric layer has a crystalline temperature;
   performing a first annealing process, wherein a first process gas comprising a plurality of radicals is introduced during the first annealing process, and a process temperature of the first annealing process is substantially smaller than the crystalline temperature; and
   performing a second annealing process to crystallize only the top portion of the high-k dielectric layer, wherein a second process gas is introduced during the second annealing process, a reactivity of the second process gas is lower than a reactivity of the first process gas, and a process temperature of the second annealing process is substantially larger than the crystalline temperature.

2. The method for processing a high-k dielectric layer according to claim 1, wherein a material of the high-k dielectric layer comprises hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate ($SrBi_2Ta_2O_9$, SBT), lead zirconate titanate ($PbZr_xTi_{1-x}O_3$, PZT), barium strontium titanate ($Ba_xSr_{1-x}TiO_3$, BST) or a combination thereof.

3. The method for processing a high-k dielectric layer according to claim 1, wherein the process temperature of the first annealing process is substantially smaller than 500 degrees centigrade (C).

4. The method for processing a high-k dielectric layer according to claim 3, wherein the process temperature of the first annealing process is substantially between 300 C and 400 C.

5. The method for processing a high-k dielectric layer according to claim 1, wherein the radicals of the first process gas comprise oxygen radicals or nitrogen radicals.

6. The method for processing a high-k dielectric layer according to claim 1, wherein the second annealing process comprises a laser spike annealing process.

7. The method for processing a high-k dielectric layer according to claim 1, wherein the second process gas comprises nitrogen ($N_2$).

8. The method for processing a high-k dielectric layer according to claim 1, wherein the first annealing process is performed in a first reactor chamber, and the second annealing process is performed in a second reactor chamber.

9. The method for processing a high-k dielectric layer according to claim 1, wherein the first process gas comprises oxygen radicals and the second process gas comprises nitrogen ($N_2$).

10. The method for processing a high-k dielectric layer according to claim 5, wherein the oxygen radicals of the first process gas are formed by ionization of oxygen ($O_2$) or ozone ($O_3$), and the nitrogen radicals of the first process gas are formed by ionization of ammonia ($NH_3$).

11. The method for processing a high-k dielectric layer according to claim 1, wherein the first annealing process is performed to recover defects on or around a surface of the high-k dielectric layer.

12. A method for processing a high-k (high dielectric constant) dielectric layer, comprising:
   providing a semiconductor substrate;
   forming a high-k dielectric layer as an amorphous film on the semiconductor substrate, wherein the high-k dielectric layer has a crystalline temperature;
   performing a first annealing process, wherein a process temperature of the first annealing process is substantially lower than the crystalline temperature; and
   performing a second annealing process to form a localized crystalline region in the high-k dielectric layer, wherein a process temperature of the second annealing process is substantially higher than the crystalline temperature and the entire crystalline region is located away from an interface between the high-k dielectric layer and the semiconductor substrate.

13. The method for processing a high-k dielectric layer according to claim 12, wherein a first process gas is introduced during the first annealing process and a second process gas is introduced during the second annealing process, and a reactivity of the second process gas is lower than a reactivity of the first process gas.

14. The method for processing a high-k dielectric layer according to claim 13, wherein the first process gas comprises oxygen radicals and the second process gas comprises nitrogen ($N_2$).

* * * * *